(12) United States Patent
Smith et al.

(10) Patent No.: US 6,885,043 B2
(45) Date of Patent: Apr. 26, 2005

(54) ASIC ROUTING ARCHITECTURE

(75) Inventors: Lyle Smith, Menlo Park, CA (US);
Eric Dellinger, San Jose, CA (US);
Eric West, San Jose, CA (US);
Shridhar Mukund, San Jose, CA (US)

(73) Assignee: Lightspeed Semiconductor Corporation, Sunnyvale, CA (US)

( * ) Notice: Subject to any disclaimer, the term of this patent is extended or adjusted under 35 U.S.C. 154(b) by 29 days.

(21) Appl. No.: 10/051,237

(22) Filed: Jan. 18, 2002

(65) Prior Publication Data

US 2003/0155587 A1 Aug. 21, 2003

(51) Int. Cl.$^7$ .............................................. H01I 29/739
(52) U.S. Cl. ....................... 257/202; 257/208; 257/211
(58) Field of Search ................................ 257/202, 207, 257/208, 209, 211

(56) References Cited

U.S. PATENT DOCUMENTS

| | | |
|---|---|---|
| 4,161,662 A | 7/1979 | Malcolm et al. |
| 4,197,555 A | 4/1980 | Uehara et al. |
| 4,568,961 A | 2/1986 | Noto |
| 4,642,487 A | 2/1987 | Carter |
| 4,682,201 A | 7/1987 | Lipp |
| 4,745,084 A | 5/1988 | Rowson et al. |
| 4,748,494 A | 5/1988 | Yamada et al. |

(Continued)

FOREIGN PATENT DOCUMENTS

| | | |
|---|---|---|
| DD | 000279387 | 6/1990 |
| DE | 3408747 | 9/1984 |
| EP | 0408060 | 1/1991 |
| EP | 0681329 | 11/1995 |
| JP | 7211767 | 12/1982 |
| JP | 1266742 | 10/1989 |
| JP | 3283663 | 12/1991 |
| JP | 4152567 | 5/1992 |
| JP | 6077427 | 3/1994 |
| WO | WO 93/10561 | 5/1993 |

OTHER PUBLICATIONS

Greg Semeraro, David H. Albonesi, Steven G. Dropsho, Grigorios Magklis, Sandhya Dwarkadas, Michael L. Scott, "Dynamic Frequency and Voltage Control for a Multiple Clock Domain Microarchitecture," IEEE Computer Society, pp. 62–68 (Nov.–Dec. 2003).

*Primary Examiner*—Sara Crane
(74) *Attorney, Agent, or Firm*—Warren S. Wolfeld; Haynes Beffel & Wolfeld LLP

(57) ABSTRACT

An embodiment of the invention includes a routing architecture with a plurality of predesigned layers and a custom layer. The structure includes a plurality of parallel vertical tracks. In one layer, the tracks include a pin coupled to an input/output of an underlying function block and the track also includes a first portion of an unbroken conductive path. A second portion of the unbroken conductive path is formed under the pin in at least a second predesigned layer. In some embodiments, the second portion of the unbroken conductive path is formed in the second predesigned layer for some tracks and a third predesigned layer for other tracks. Hence, pins and unbroken conductive paths are multiplexed in a single track. In addition, the second predesigned layer further includes long horizontal conductors. When using the predesigned layers, the custom layer can be structured to provide free global routing with distinct local routing, all while using an array structure independent of routing channels and without rendering any function blocks unusable. Moreover, a structure in accordance with the invention includes conductors for clock distribution which can be used to form multiple independent clock domains. The structure is compact, yet flexible and can be customized in some embodiments with 1–2 masks.

33 Claims, 12 Drawing Sheets

U.S. PATENT DOCUMENTS

| | | |
|---|---|---|
| 4,851,892 A | 7/1989 | Anderson et al. |
| 4,870,302 A | 9/1989 | Freeman |
| 4,873,459 A | 10/1989 | El Gamal et al. |
| 4,875,971 A | 10/1989 | Orbach et al. |
| 4,943,841 A | 7/1990 | Yahara |
| 5,016,080 A | 5/1991 | Gianella |
| 5,023,701 A | 6/1991 | Sharpe-Geisler |
| 5,049,969 A | 9/1991 | Orbach et al. |
| 5,073,729 A | 12/1991 | Greene et al. |
| 5,084,404 A | 1/1992 | Sharpe-Geisler |
| 5,087,589 A | 2/1992 | Chapman et al. |
| 5,172,014 A | 12/1992 | El Ayat et al. |
| 5,206,184 A | 4/1993 | Allen et al. |
| RE34,363 E | 8/1993 | Freeman |
| 5,309,015 A | 5/1994 | Kuwata et al. |
| 5,338,970 A | 8/1994 | Boyle et al. |
| 5,404,033 A | 4/1995 | Wong et al. |
| 5,506,162 A * | 4/1996 | Hirose et al. .................. 437/51 |
| 5,565,758 A | 10/1996 | Yoeli et al. |
| 5,619,062 A | 4/1997 | Janai et al. |
| 5,679,967 A | 10/1997 | Janai et al. |
| 5,847,420 A | 12/1998 | Kuge et al. |
| 5,861,641 A | 1/1999 | Yoeli et al. |

* cited by examiner (M7)

(M5, M6, M7)

M5 - - - -
M6 ———
M7 ▭

(M7, M8)

(M5, M6, M7, M8)

M5 - - - - -
M6 ———
M7 ▭
M8 ▨

(M5, M6, M7, M8)

M5 - - - - - -
M6 ————
M7 ▭
M8 ▨

(M5, M6, M7, M8)

M6 ———
M7 ▭
M8 ▧

(M6,M7)

ASIC ROUTING ARCHITECTURE

FIELD OF INVENTION

The present invention generally relates to integrated circuits, and more specifically, to a routing architecture for interconnecting various IC devices and function blocks to form a customized circuit.

BACKGROUND OF THE INVENTION

ASICs (application specific integrated circuits) are widely used by electrical design engineers to include specialized circuitry in their designs using only a single chip. The term "ASIC" actually refers to a variety of integrated circuit (IC) styles that vary in degree of customizability, including standard cells, module based arrays, and gate arrays. As a general rule, the more customization that is required, the more expensive the ASIC will be and the longer the ASIC will take to fabricate and/or customize.

In forming ASICs generally, several layers will be required. FIG. 1 shows a cross-sectional view of a generic integrated circuit. First, active layers are formed on a semiconductor substrate. The active layers 110 include devices such as transistors and diodes. Most active layer devices are formed independently of one another, i.e., they are not connected to form a circuit. Thus, once active layers 110 are formed, conducting layers, which are often composed of a metal such as aluminum or copper but can be formed with other conductors, are formed over the active layers to interconnect the devices, thereby forming a circuit. Several metal (or other conducting) layers maybe required to completely interconnect the devices to form a useful circuit. Four metal layers, M1 120, M2 130, M3 140 and M4 150, are shown in FIG. 1. Of course, different types of ICs may require more or less than four metal layers for circuit interconnection.

In between each metal layer is an insulating layer 115, 125, 135, 145 as shown in FIG. 1. Insulating layers are present to prevent shorts between metal layers. To interconnect the metal layers, vias 116 are formed through the insulating layers.

In forming the structure of FIG. 1, after the active layers 110 are formed, an insulating layer 115 is formed over the active layers 110, for instance, by growth or deposition of insulating material. Next, a masking step is utilized to form vias in the insulating layer, as is generally known in the art. Such masking often entails depositing a photoresist layer and patterning the layer using ultra-violet light, enabling removal of only selected portions of the photoresist, and then etching the insulating layer in accordance with the photoresist pattern. After forming the vias, a metal layer is deposited and then patterned using a similar masking process, so that metal remains only in desired locations. The process is repeated for each insulating layer and metal layer required to be formed.

Thus each metal layer required to be formed generally demands at least two masking steps: one step to form vias through the insulating layer to connect to the layer below and one step to form connection wires or lines. Unfortunately, each mask step required generally entails significant time and expense.

At the active layer level, ASIC active devices are generally arranged to form an array of function blocks, also commonly referred to as cells or modules. To interconnect active devices within each function block (i.e., form "local interconnections") a series of horizontal and vertical connection lines formed in the metal layers are utilized. As is well understood in the art, any two points can be connected using a series of horizontal and vertical connection lines. While such local interconnections can be done in one metal layer, more typically, horizontal connections are formed in a first metal layer and vertical connections are formed in a second metal layer with an insulating layer having vias formed between.

As should be understood and as used herein, "horizontal" is meant to describe all metal lines running in a first direction such that all horizontal lines lie substantially parallel to one another. "Vertical" is meant to convey all lines that run in a second direction which is substantially perpendicular to the first (horizontal) direction. Neither "horizontal" nor "vertical" is meant to convey anything more specific than relative position to one another. Moreover, as should be understood by those of skill in the art, horizontal lines and vertical lines are formed in the metal layers which are parallel to the active layer surface. "Horizontal" and "vertical" do not convey lines that are perpendicular to the active layer surface.

The local interconnections within each function block described above are typically quite dense, and often function blocks themselves must be connected together (i.e., circuit or global "routing"). Yet routing in lower metal layers over function blocks is often impractical due to the large number of obstructions formed by the local interconnections in those lower layers. Therefore, in order to form connections between the function blocks, routing has typically been done "around" the function blocks and will be discussed below with respect to FIGS. 2–3.

The Channeled Approach

One function block routing solution is shown in FIG. 2, showing a generalized plan view of a standard cell-type ASIC. As shown, in a standard cell, each function block 160 (160a–160i) will vary in horizontal size with respect to one another (although they are typically structured to have the same vertical height). Function blocks 160 are shown with dashed lines to indicate their conceptual formation in active layers 110. As discussed above and as shown in function block 160d, local interconnections within each function block are typically formed by horizontal lines in M1, e.g., 174, 176, and vertical lines in M2, e.g., 178. The horizontal and vertical lines are connected in their respective layers by vias, shown as "dots." Vias may not only connect M1 and M2 to each other but may also connect M1 and/or M2 to an active layer.

The function blocks 160 are further formed into rows 170a, 170b, 170c. Each row is separated from one another by a "channel" region 172a, 172b. The channel region is then used for horizontal routing between function blocks to avoid routing over the function block space. For instance, referring to FIG. 2, channel lines 180–182 and 184–186 are formed in channels 172a and 172b, respectively, using M1. Vertical lines 190–199 are formed in M2. Vertical lines 190–193 are used to couple the active devices in function block 160d to channel lines. The channel lines in turn are further connected (in M2) to other function blocks, e.g., with vertical lines 194–199. As shown, the channel lines can run the entire length of the channel or can run for a short distance within the channel.

Vias in the function block are connected to channel lines with connector lines that enter from above the function block, e.g., line 192, from below the function block, e.g., line 193, or double entry (connected from above and below), e.g., lines 190, 191. Lines could also simply "feed-through" the function block with no connection to a via; however, feed-throughs are often impractical because of dense local interconnections within the function blocks, limiting routing flexibility.

Gate arrays, like standard cells, have also used an approach as described above with reference to FIG. 2. That is, gate arrays have also been fabricated with channels to use for routing between function blocks. In gate arrays, however, the active layers are fixed (non-customizable), having a predefined number and arrangement of active devices in each function block. Thus, while fully-customizable standard cells can customize channel size larger or smaller, in gate arrays the channel size is fixed, further limiting routing flexibility.

In summary, the "channel" technique described with respect to FIG. 2, conventionally does all routing among function blocks in the channel regions. The only M1 metal outside of each function block (i.e., not used for local interconnections) is located in the channel regions, between rows of function blocks.

The Channel-less Approach

Another approach often used for routing interconnections among gate array function blocks and described with reference to FIG. 3 is a "channel-less" approach. Each function block 302 (302a–302i) is substantially contiguous to adjoining function blocks on each side—in other words, no routing channels are formed. Using substantially contiguous function blocks can increase the functionality available per IC since no fixed space is wasted for channels. Like the "channeled" approach, local interconnections within each function block are still typically formed with horizontal and vertical connections using M1 and M2, respectively, such as shown in function block 302g. Nonetheless, routing among function blocks is still restricted in that routing lines cannot always cross over the used function block space due to the local interconnect density. Therefore, typically in the channel-less structure of FIG. 3 routing is also done over selectively unused function blocks. Occasionally, even whole rows of function blocks are selectively unused in order to allow routing much like a channeled device, although more commonly only individual function blocks are selected to be reserved for routing, e.g., function blocks 302d and 302e.

The Time-Space Factors

Because of limitations in the metalization process, typically only a few metal layers have been used for routing conventionally. Nonetheless, recent developments in metalization and planarization technologies, particularly in the area of chemical-mechanical polishing (CMP), have allowed more metal layers to be formed. Still, in each of these techniques described above, both channeled and channel-less, considerable customized routing (for both standard cell and gate arrays) is done in the M1 and M2 layers. Additional customized layers are also often used. Therefore, at least four masking steps (two for each metal layer) are required to form a customized circuit. Yet, as previously mentioned, each custom mask step will take considerable time and money.

Often important to an IC or electronic circuit designer is customization time. Particularly during the design stages, the engineer may want to obtain a model, or prototype, of his or her designs quickly so that the designs can be tested with other circuitry. In such circumstances, the engineer may opt for a gate array because, although not as flexible as standard cells, it will be faster to get a working chip because fewer mask steps are required for circuit customization (i.e., standard cells require formation of active devices, while gate arrays have preformed active devices and only require metalization). Nonetheless, gate arrays can still take several weeks' time or much longer to obtain because of the multiple custom mask steps that must be performed just for metalization.

Further, it is generally important to the design engineer to obtain the smallest chip possible containing the maximum amount of functionality. Using a channeled scheme, space used for channels obviously takes away real estate that could otherwise be used for more function blocks or, if removed, would reduce IC size. Of course, using the channel-less scheme described above, otherwise usable function blocks are often unusable. While some companies have gone so far as to develop techniques that require only one mask step for customization, thus reducing turn-around time, almost all of these companies have continued to use channel regions, increasing IC size and/or reducing IC functionality and routing flexibility. Clearly then, any customizable circuit that can decrease turn-around time while simultaneously maintaining a high degree of functionality and routing flexibility is desirable.

SUMMARY OF THE INVENTION

In accordance with an embodiment of the invention, a routing structure for an integrated circuit is disclosed that is compact, flexible, and permits a rapid turn-around time. More specifically, in one embodiment of the invention, such a structure includes a plurality of predesigned layers and a custom layer. The structure is formed over a plurality of function blocks, which form an array in one embodiment. The structure includes a plurality of parallel vertical tracks. In one of the plurality of predesigned layers and within the tracks are formed conductors, including: a pin, which is in communication with an input or output from an underlying function block; and a first portion of an unbroken conductive path, sometimes referred to herein as a freeway. A second portion of the unbroken conductive path is formed in at least a second predesigned layer, generally under the pin. In some embodiments, the second portion of the unbroken conductive path is formed in a second predesigned layer for some tracks and a third predesigned layer for other tracks. Hence, a pin and a long vertical route are multiplexed in each track, respectively. Nonetheless, before the custom layer is placed, the pins and freeways remain uncoupled to, and thus independent of, one another. In some embodiments, the second predesigned layer further includes long horizontal conductors formed under portions of the freeways.

When the custom layer is placed, it is placed to selectively form interconnections among pins, long vertical routes, and long horizontal routes. In this manner, devices in the underlying function blocks can be connected and function blocks themselves can be interconnected. In one embodiment, the custom layer is formed in two regions: a local routing portion—over the pins—and a global routing portion.

In some embodiments, one of the predesigned layers further includes conductors useful for clock distribution. In some embodiments, by using these clock conductors multiple independent clock domains can be easily formed.

As a result, a routing structure is formed over the function blocks in a manner that is independent of any channels and that does not render any function blocks unusable. Such a structure further provides free global routing while providing distinct local routing. Finally, because the structure allows routing both above and below pins and other parts of the routing fabric, the structure is not only compact and flexible, but permits one-mask customization.

BRIEF DESCRIPTION OF THE DRAWINGS

The invention will be described with respect to particular embodiments thereof, and reference will be made to the drawings, which are not necessarily drawn to scale, and in which.

DETAILED DESCRIPTION

Figure 1:
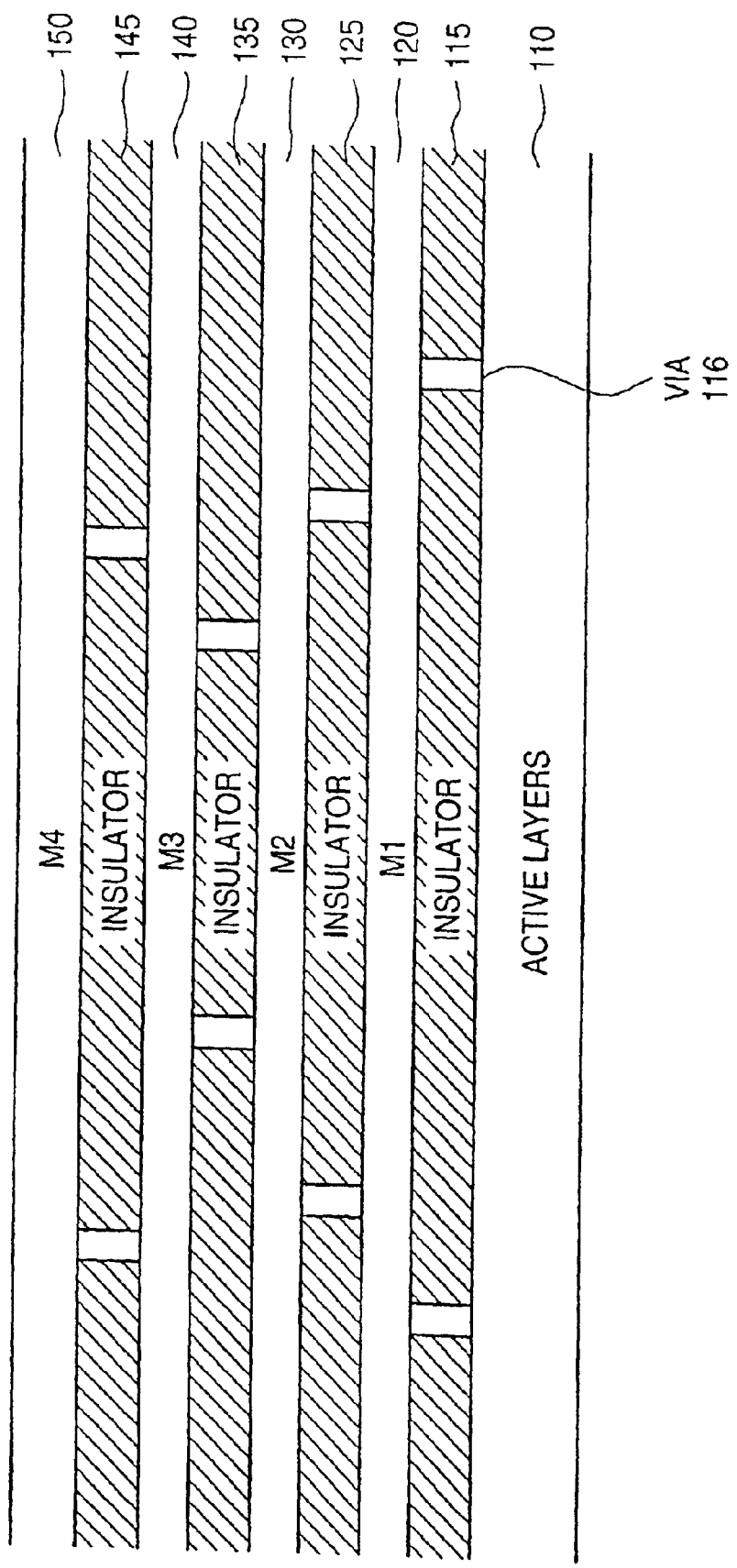
FIG. 1 is a cross-sectional view of a generic integrated circuit.
Figure 2:
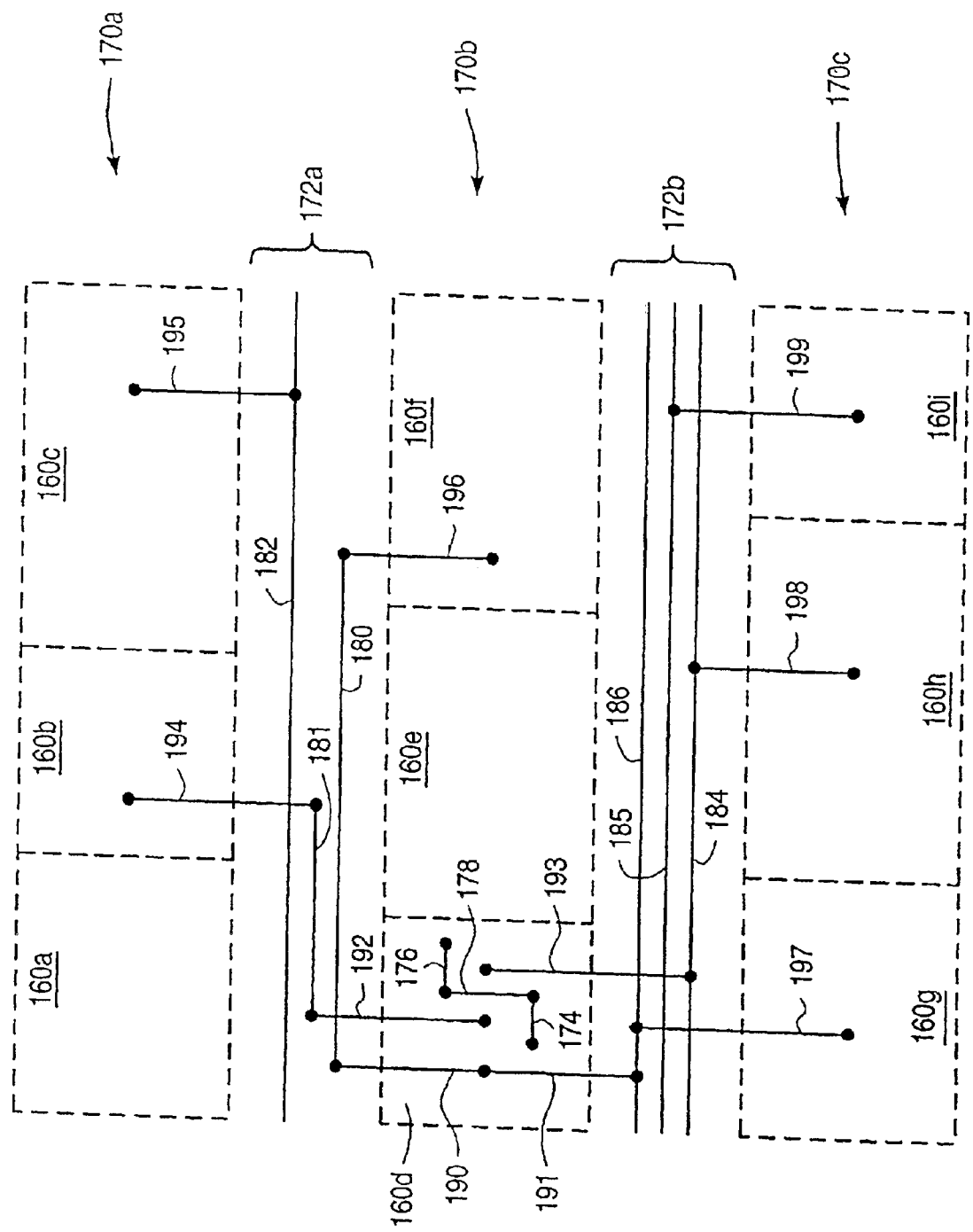
FIG. 2 is a generalized block diagram of a standard cell ASIC using channeled routing.
Figure 3:
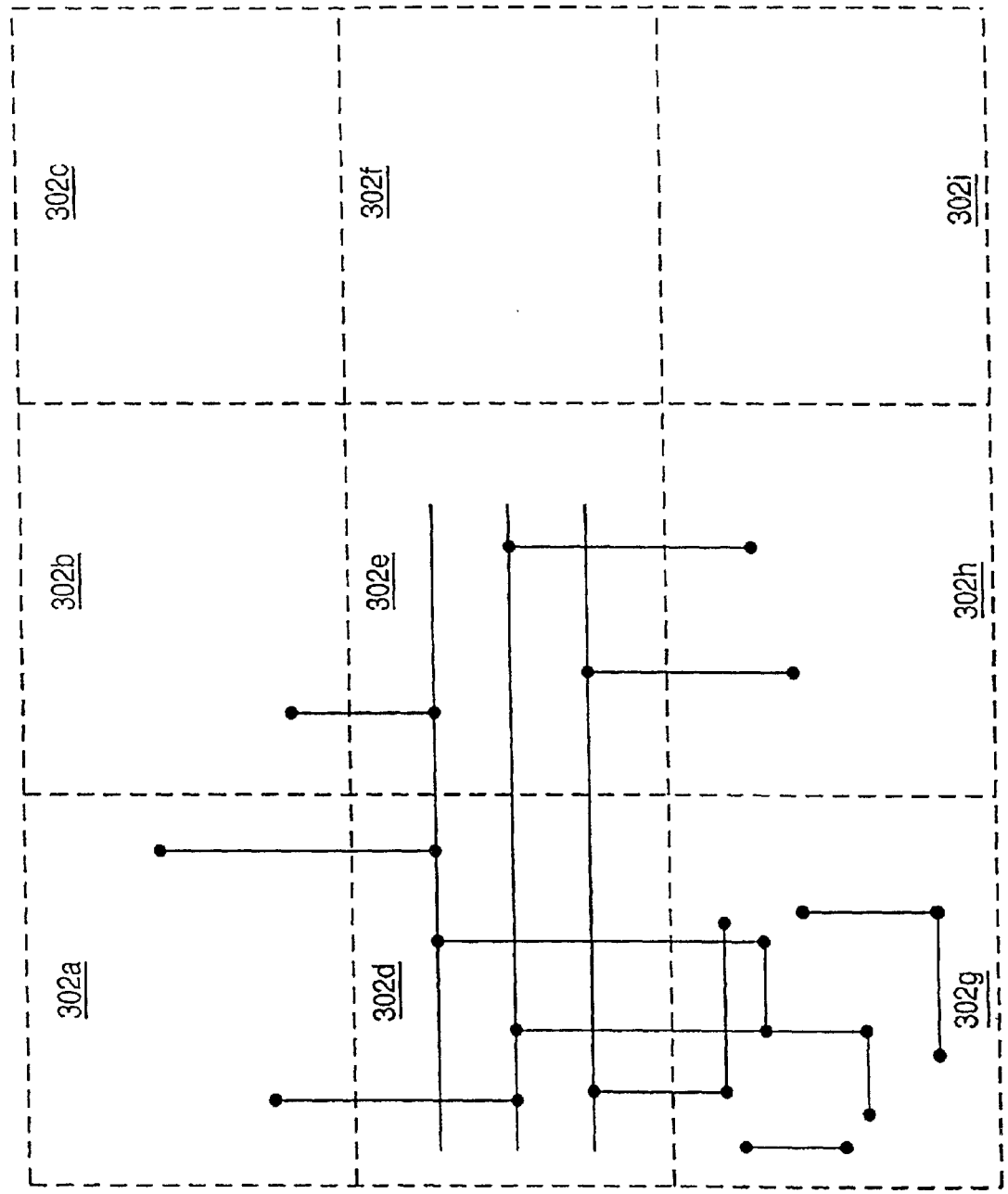
FIG. 3 is a generalized block diagram of a gate array using a channel-less routing approach.
Figure 4:
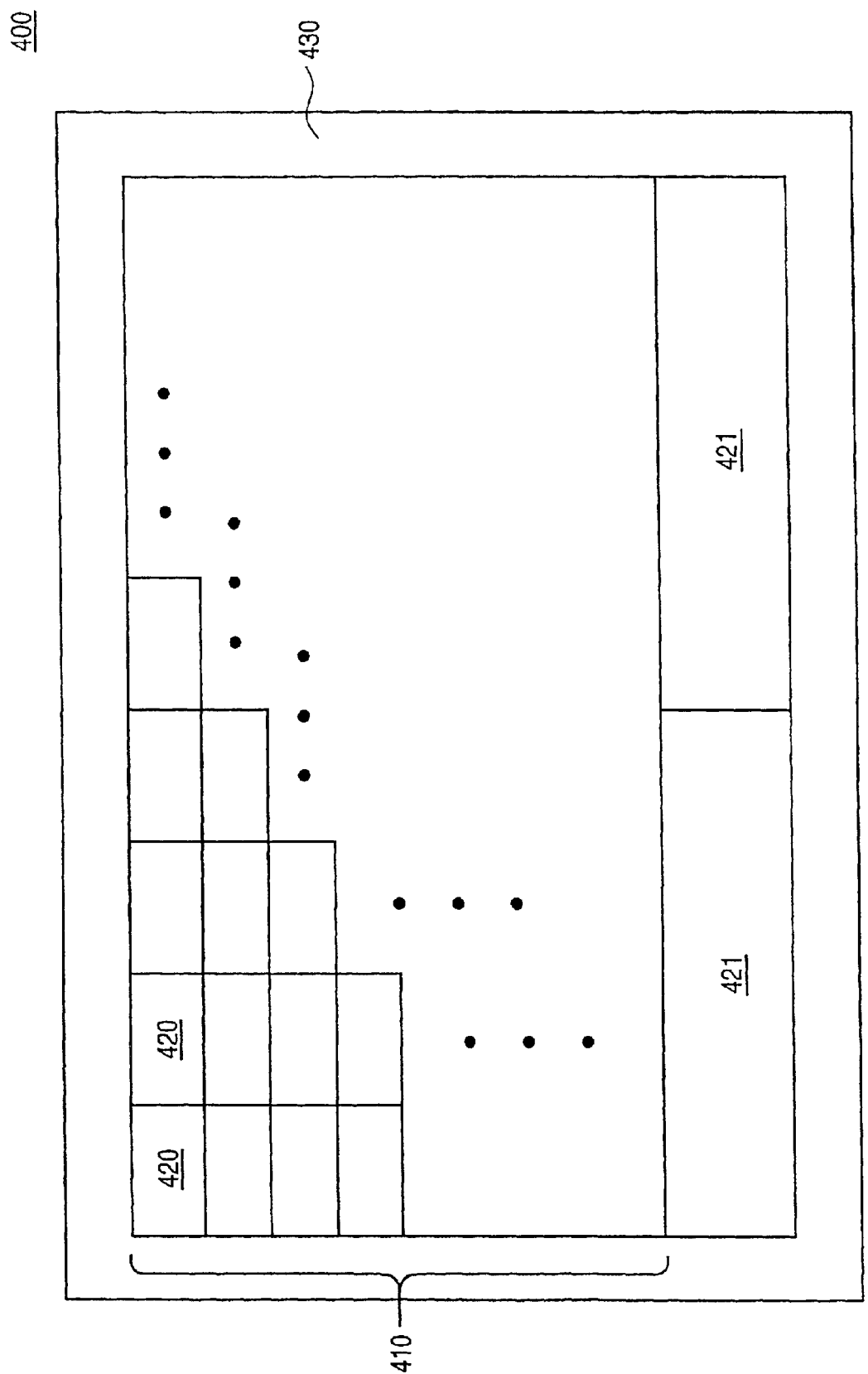
FIG. 4 is a generalized block diagram of an ASIC in accordance with the invention.

A generalized block diagram of an ASIC 400 in accordance with the invention is shown in FIG. 4. ASIC 400 includes an array 410 of function blocks 420. In one embodiment of the invention, each function block 420 is identical to the other function blocks in array 410, although other embodiments of the invention allow for variance among function blocks. Some embodiments may include one or more other regions 421, which contain other circuitry such as memory blocks or logic cores. Also shown in FIG. 4 is periphery area 430 surrounding array 410. Periphery area 430 includes circuitry such as I/O pads and other support circuitry for array 410.

Figure 5:
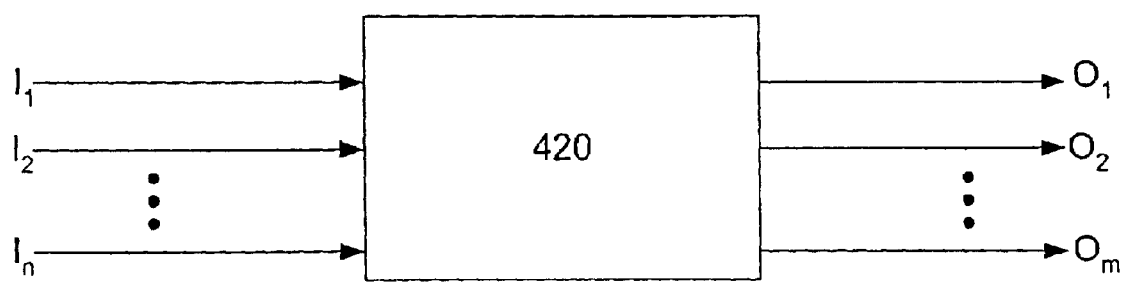
FIG. 5 is a generalized block diagram of a function block in accordance with one embodiment of the invention.

As shown in FIG. 5 each function block 420, has any number of inputs, $I_1 \ldots I_n$, and any number of outputs, $O_1 \ldots O_m$. Each function block 420 is further generally comprised of a fixed set of active devices arranged in a fixed manner with respect to one another. In some embodiments, the active devices are arranged into a collection of gates that can be configured to perform a variety of functions, including combinational functions, sequential functions and/or memory functions (e.g., SRAM). In some embodiments, the function performed by each function block is selected by connecting the inputs of the function block to selected signals. For instance, the function may be selected by connecting an input to a logical high signal, a logical low signal, the output of the same or different function block, or a signal from off-chip. In other embodiments, the function performed by the function block is selected by not only selectively connecting the inputs of the function block to other signals, but also by forming additional connections among active devices (such as gates) within the function block, e.g., if the function block is a collection of independent multiplexers and AND gates, the function of the block may be partially chosen by interconnecting those multiplexers and AND gates.

As shown in FIG. 4, each function block 420 is substantially contiguous to each adjacent function block. In other words, no channels are formed between the function blocks 420 in one embodiment of the invention.

A considerable amount of the routing internal to each function block 420 (local routing) will be fixed (non-customizable) and lower metal layers, e.g., M1 and M2, can be predesigned and/or pre-formed, using horizontal connectors in M1 and vertical connectors in M2 (or vice versa). For instance, gates such as AND gates and multiplexers can be formed by interconnected devices such as transistors. Of course, more than two metal layers can be used to form the local interconnections within each function block 420 in various embodiments of the invention.

As described, an array in accordance with the invention will be customized by the selective connection of the inputs of each function block. Thus, the customization of the array generally entails forming connections between two or more function blocks and forming connections of the function block inputs to power and ground lines. Hence, in one embodiment, customization of the array to form a user-defined circuit is done by routing, e.g., connecting an input to power, to ground, or to an input or output of another function block. In order to allow fast customization time, but maintain flexibility in routing (and thereby customization) the architecture in accordance with an embodiment of the invention allows customized routing—both global and local—in the uppermost four conducting layers for a given integrated circuit. For ease of discussion, these uppermost four conducting layers will be referred to as M5 through M8, where it is assumed that any fixed local routing occurs in layers M1–M4. It is to be understood, however, that since there could be more or fewer than eight conducting layers in a particular embodiment of the invention, use of the terms M5, M6, M7, and M8 are not intended to limit the invention, but are only for convenience of discussion.

Figure 6:
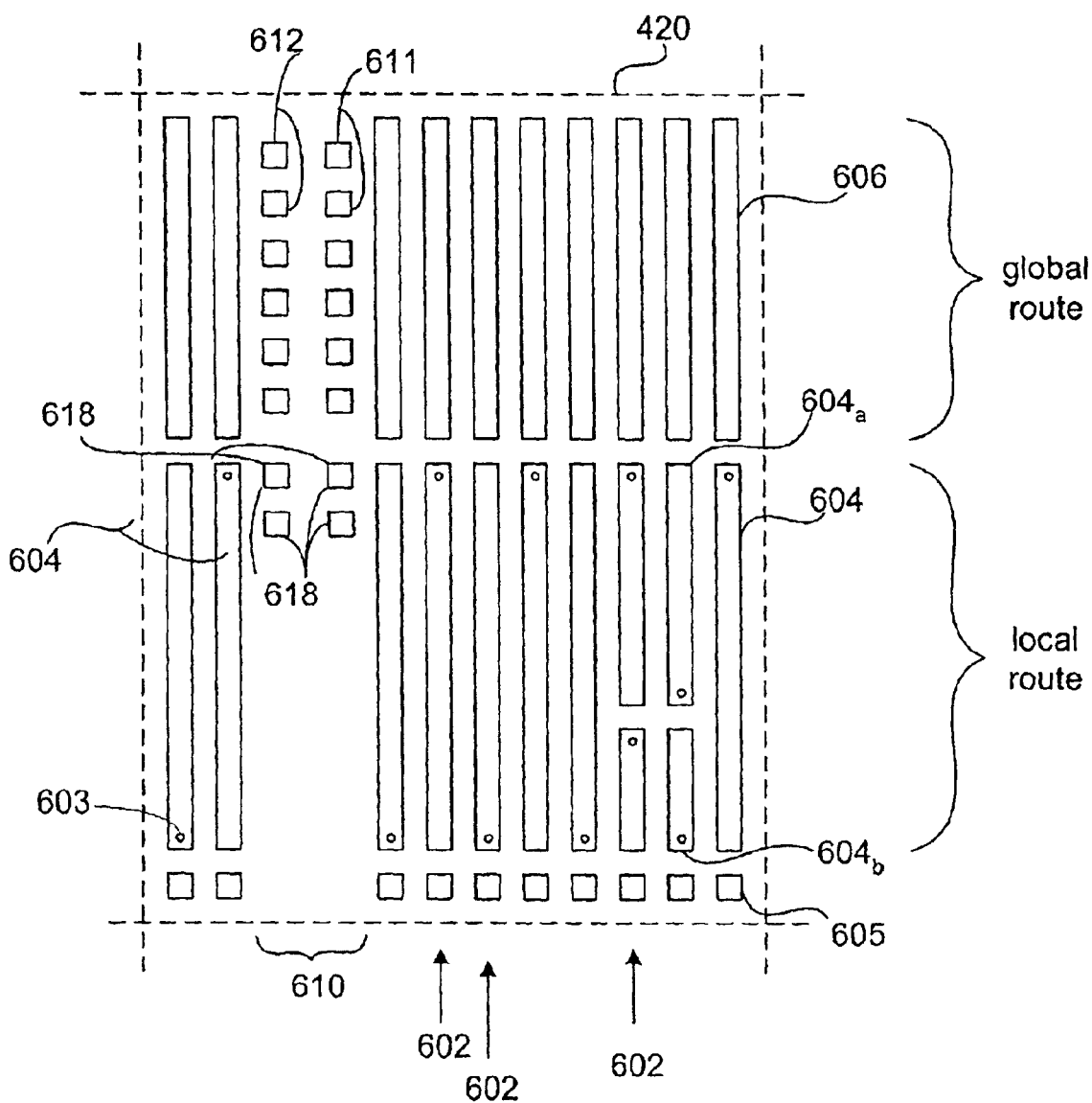
FIG. 6 is a plan view diagram illustrating one of the conducting layers in accordance with an embodiment of the invention.

Referring now to FIG. 6, that portion of the routing structure in accordance with an embodiment of the invention for layer M7, or the second-to-uppermost conducting layer, is shown. As shown in FIG. 6, conductors are arranged in a plurality of parallel vertical tracks 602. The tracks 602 shown in FIG. 6 are formed over a single function block 420 (shown with dashed lines). The conductors are segmented, and in most tracks contain segments 604, 605, and 606. The term "track" as used herein designates an area for the placement of conductors, but does not designate the conductors themselves.

Segments 604 are generally those segments towards the middle of the routing structure as illustrated, in one embodiment. Segments 604 form a connection to an input or output of the underlying function block. Accordingly, segments 604 are sometimes referred to as "pins." As will be understood by those of skill in the art, such connections are formed using vias 603 to one or more layers below. As shown in the figure, vias 603 are formed at opposite ends of adjacent pins in one embodiment. Other embodiments, however, may use a different via placement to connect the pins to the underlying inputs and outputs of the function block.

In some embodiments, a segment 604 is further segmented into two or more segments such as $604_a$ and $604_b$. Segments $604_a$ and $604_b$ form what is termed a "split pin." Each segment $604_a$ and $604_b$ forms a connection to a respective input or output of the underlying function block. Thus, split pins are essentially two or more pins formed in a single track 602, and thereby can be used to reduce the number of tracks required.

It is often desirable to form "long" conductors when routing for carrying signals longer distances. Segments 605 and 606, formed towards the bottom and top of the illustrated embodiment of the M7 structure respectively, are used to form such long conductors. In an embodiment of the invention, segments 605 and 606 can be used for forming long vertical conductors that run for the vertical height of a function block 420. Nonetheless, because segments 605 and 606 are interrupted in tracks 602 by pins 604, one or more lower layers are also used in the formation of such long vertical conductors in one embodiment.

Figure 7:
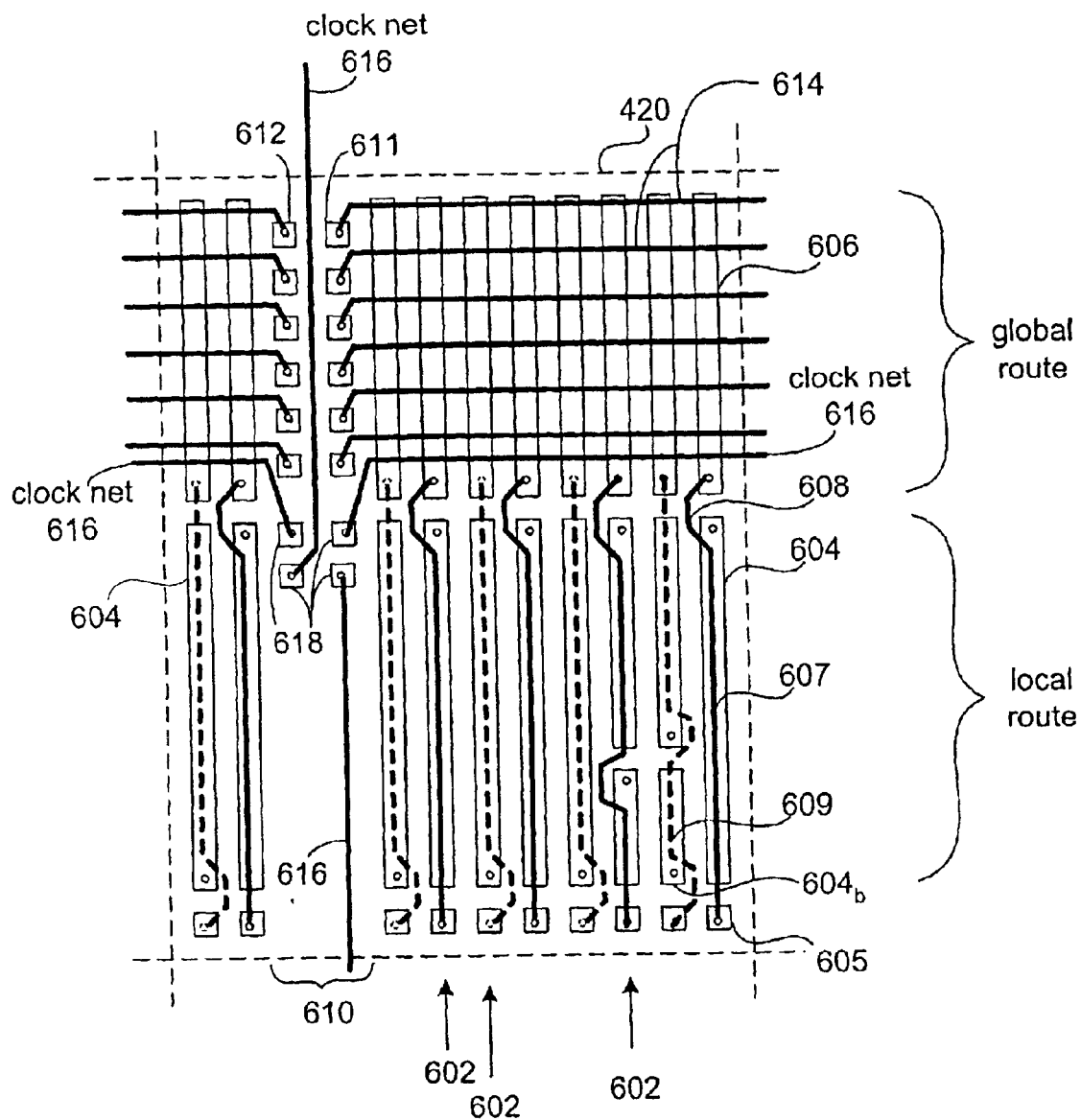
FIG. 7 is a plan view diagram illustrating the layer shown in FIG. 6 along with two additional layers in accordance with an embodiment of the invention.

FIG. 7 shows layers M5 and M6 as well as the M7 layer. For every other track 602, when a segment 606 reaches a pin 604, the segment 606 is connected by a via to a conductor 607 in the M6 layer. In one embodiment, conductor 607 generally runs under pin 604—except for a small jog 608 to avoid the via to pin 604—ultimately connecting to segment 605 by a via. Hence, segments 605 and 606 with "underpass" 607 form an unbroken conductive path that runs the vertical height of the function block 420. Similarly, for every track adjacent to a track with an underpass 607 in the M6 layer, a similar underpass 609 is formed in the M5 layer. Thus every other segment 606 is coupled to underpass conductor 609 with a via, and underpass 609 is further coupled to segment 605.

The unbroken conductive path formed by segments 605, 606, and 607 (or 609) is referred to herein as a "freeway". Although as illustrated, a freeway runs the vertical height of a function block 420, other embodiments may utilize similar unbroken conductive paths of differing lengths although such paths will typically be longer than the pin. In its track 602 each pin 604 has access to its respective freeway either immediately above or below the pin 604, by way of conductors 605 or 606, allowing flexibility in routing. Thus, as shown in FIGS. 6 and 7, for every track in which there is a pin, there is also a freeway. The formation of freeways on multiple conducting layers further serves to reduce capacitance and prevent coupling between long parallel unbroken conductive paths.

Figure 12:
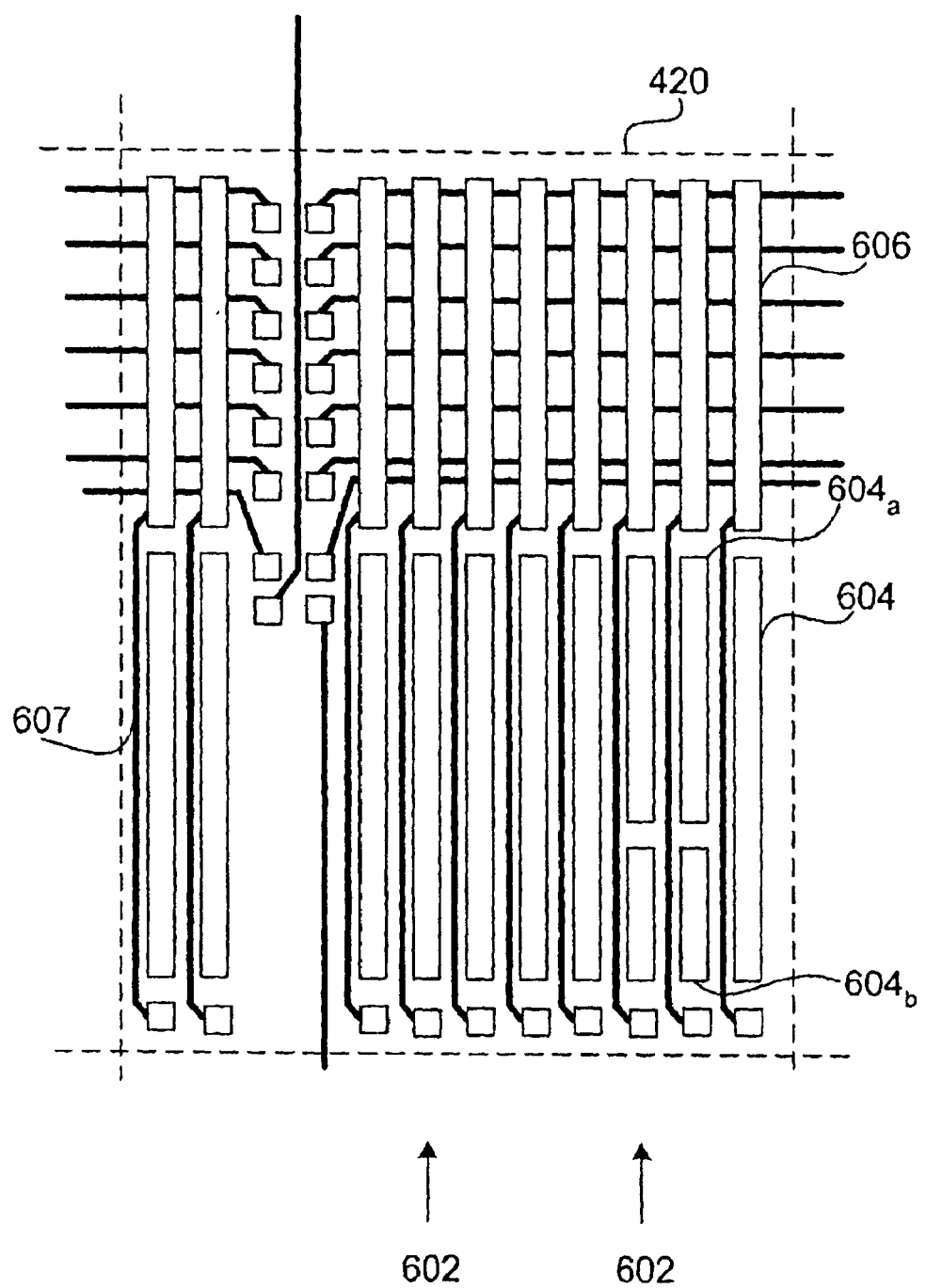
FIG. 12 is a plan view diagram illustrating the layer shown in FIG. 6 along with another layer in accordance with an alternative embodiment of the invention.

As shown in FIG. 7, the underpasses 607 and 609 are formed in different layers, M6 and M5, respectively. The different layers are used so that the most compact structure can be formed—i.e., tracks can be placed relatively close together. Other embodiments, however, could have all underpasses run under pins 604 in a single layer, e.g., M6. Such an embodiment is shown in FIG. 12. Still other embodiments could use more layers for the underpasses than shown in FIG. 7. Still other embodiments may place more than one freeway in a particular track, although some pins may have limited access to some freeways in the respective track in such circumstances.

Returning to FIG. 6, in the M7 layer, in addition to tracks 602, there is a region 610. Region 610 includes small segments 611 (on the right) and 612 (on the left), both adjacent to segments 606 and at the top of the illustrated embodiment of the structure.

Referring again to FIG. 7, in addition to the freeway underpasses 607, in the M6 layer there are horizontal conductors 614. In one embodiment, a conductor 614 runs through two function blocks 420, having an initial connection (through at least one via) to a conductor 611 in the M6 layer in a first function block 420, and terminating at conductor 612 in the function block horizontally adjacent to the right. This horizontal routing allows the formation of long conductors among function blocks that are immediately adjacent to another in a horizontal direction. Thus, horizontal conductors 614 enable the ability to route horizontally under the structure of M7.

Further in FIG. 7, in the M6 layer four conductors 616 are formed. Each conductor 616 is connected (by at least one via) to a respective conductor 618 in the M7 layer. Conductors 616 are used in one embodiment for clock distribution. Hence, in one embodiment conductors 616 are shielded routes used to build clock trees. The clock signal carried on conductors 616 in most embodiments will typically originate from outside of the function block. Nonetheless, in any embodiment where extensive clock distribution is not used, conductors 616 as well as the conductors 618 could be used for other functions.

Although conductors 611, 612, and 618 are shown as formed between certain tracks 602 for a particular function block 420, other embodiments may place such conductors in other locations.

The routing structure as described with respect to FIGS. 6 and 7 is fixed (predesigned) and not customizable by a user of the resulting integrated circuit. However, referring to FIG. 8 the uppermost conducting layer, M8, is customizable and is mask programmed in some embodiments of the invention. In one embodiment, customized routing in the M8 layer is generally functionally divided into two sections: one for local routing 620 and one for global routing 622.

Figure 8:
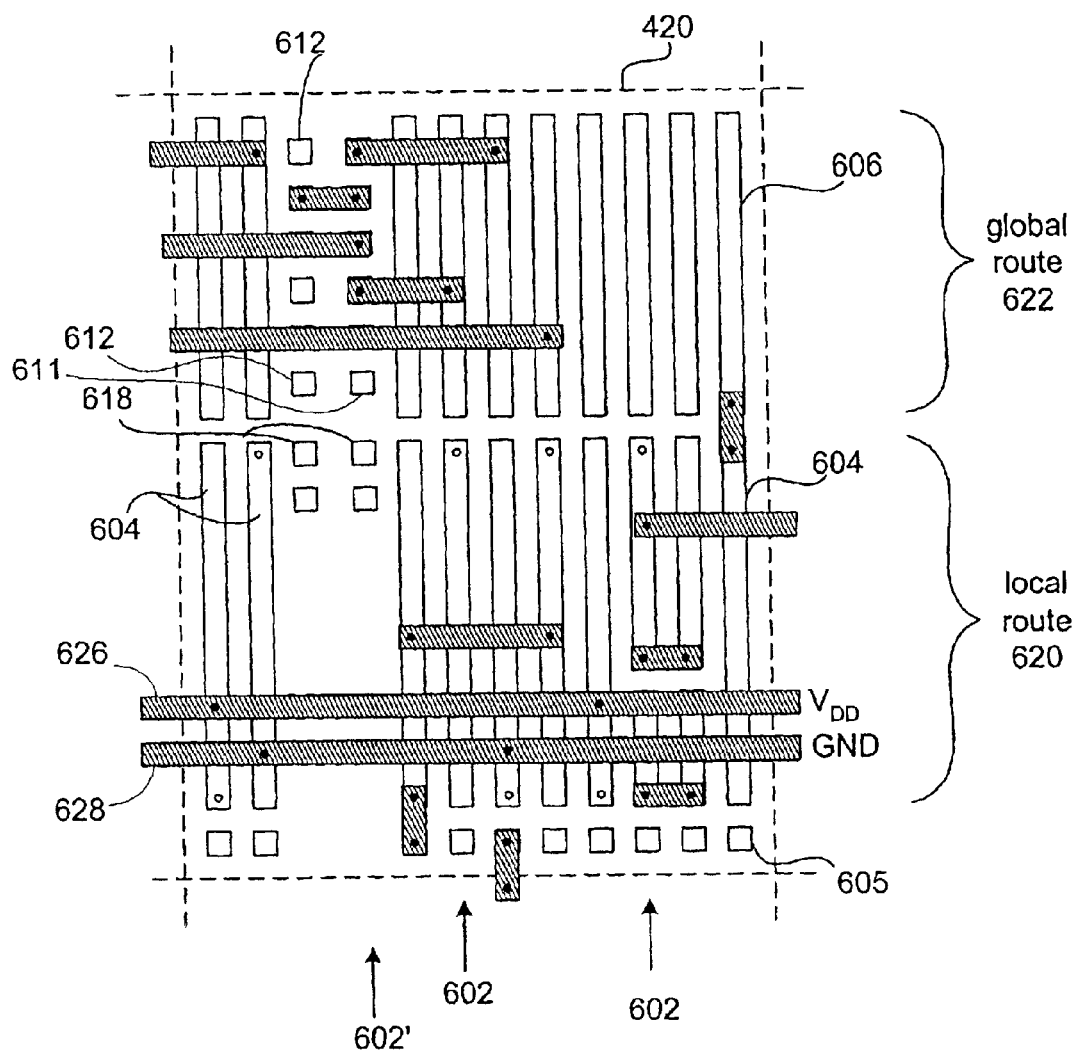
FIG. 8 is a plan view diagram illustrating the layer shown in FIG. 6 along with a customized layer in accordance with an embodiment of the invention.

The first section 620 is used for local routing. In one embodiment, local routing is performed over the area occupied by the pins 604. Local routing is typically used to interconnect gates or other devices within a single function block 420 and is, therefore, best done over the area occupied by pins 604. As shown in FIG. 8, pins 604 can be connected to other pins 604 or pins 604 can be connected to freeways, e.g., by connecting to segment 605 or 606.

As further shown in FIG. 8, in addition to the customized local routing over the pins, power ($V_{dd}$) and ground lines 626 and 628 are also provided. Hence, pins 604 can further be connected by custom routing in M8 to power or ground and can be connected without blocking freeways. Actual placement of the power and ground lines 626 and 628 can be fixed (predesigned) or customizable.

Area 622, which is over the space occupied by segments 606, is generally used for global routing in one embodiment. Global routing is used to interconnect the various function blocks 420. In the area 622, horizontal routes are formed in layer M8 and can interconnect one freeway to another in the same function block, one freeway to another in different function blocks, or freeways to long horizontal conductors 614 by connecting to conductors 611 or 612. In addition, long horizontal conductors 614 (not shown in FIG. 8) can also be interconnected to make even longer horizontal conductors by connecting conductors 611 and 612 to one another. Still, because horizontal routing is split between the M6 and M8 layers, horizontal routes avoid coupling and reduce capacitance. Finally, conductors in M8 can be placed to connect one freeway in one function block to a freeway in a vertically adjacent function block, allowing for even longer vertical conductors, e.g., by connecting a conductor 605 in a first function block to a conductor 606 in the function block immediately below.

Although regions that are primarily used for local routing and global routing are used in one embodiment of the invention, other embodiments may not distinguish the two.

As shown in FIG. 8, routing in the uppermost layer is not limited to one direction, but can be done in both the horizontal and vertical directions. It should also be understood that not only is the uppermost layer a customized layer, but the via layer between M7 and M8 is also customized to allow the selective placement of vias coupling the M7 to the M8 layer. In FIG. 8, vias are shown as "dots" within the selectively placed conductors.

Figure 9:
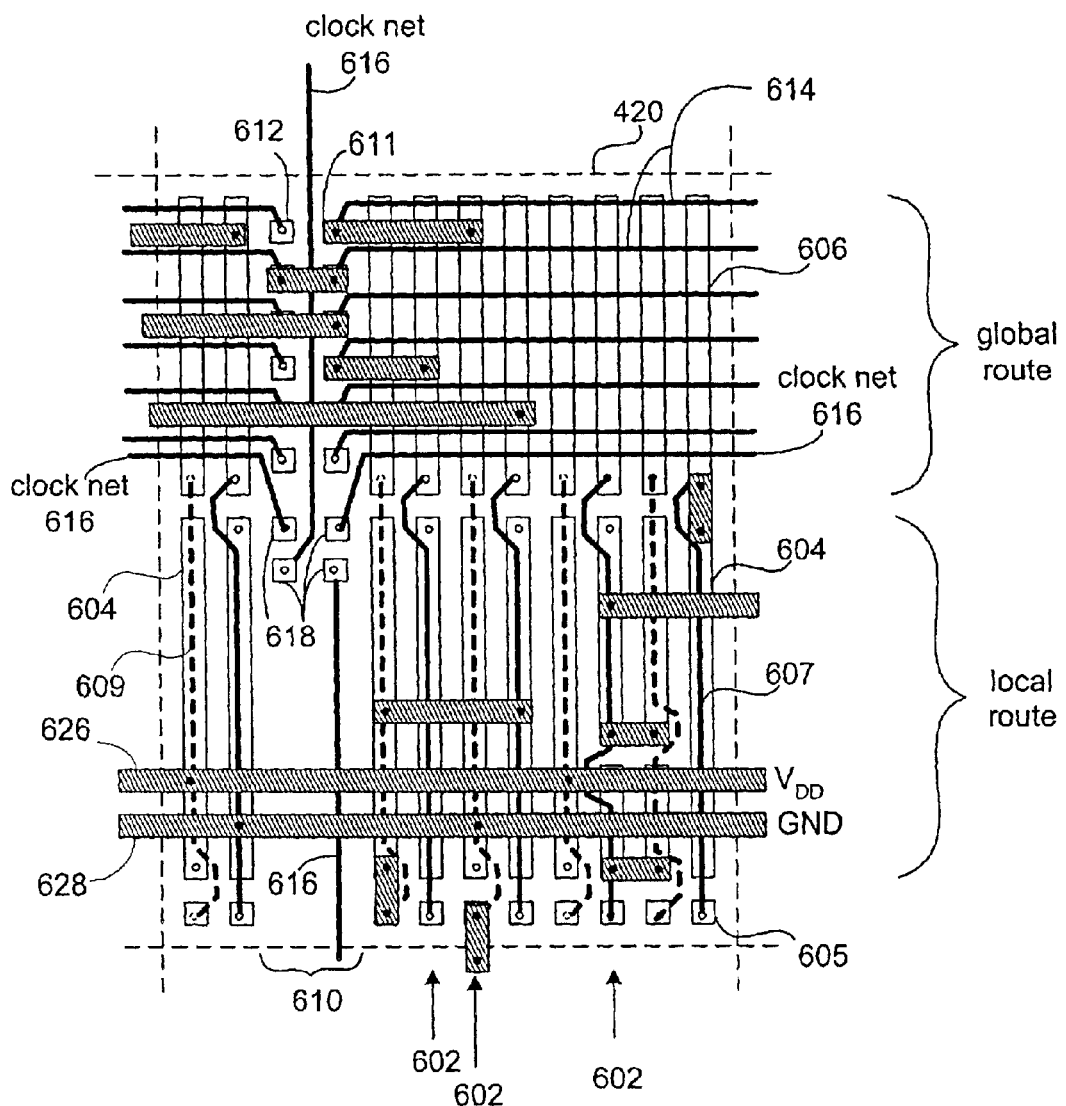
FIG. 9 is a plan view diagram illustrating all four of the layers shown in FIGS. 6–8.
Figure 10:
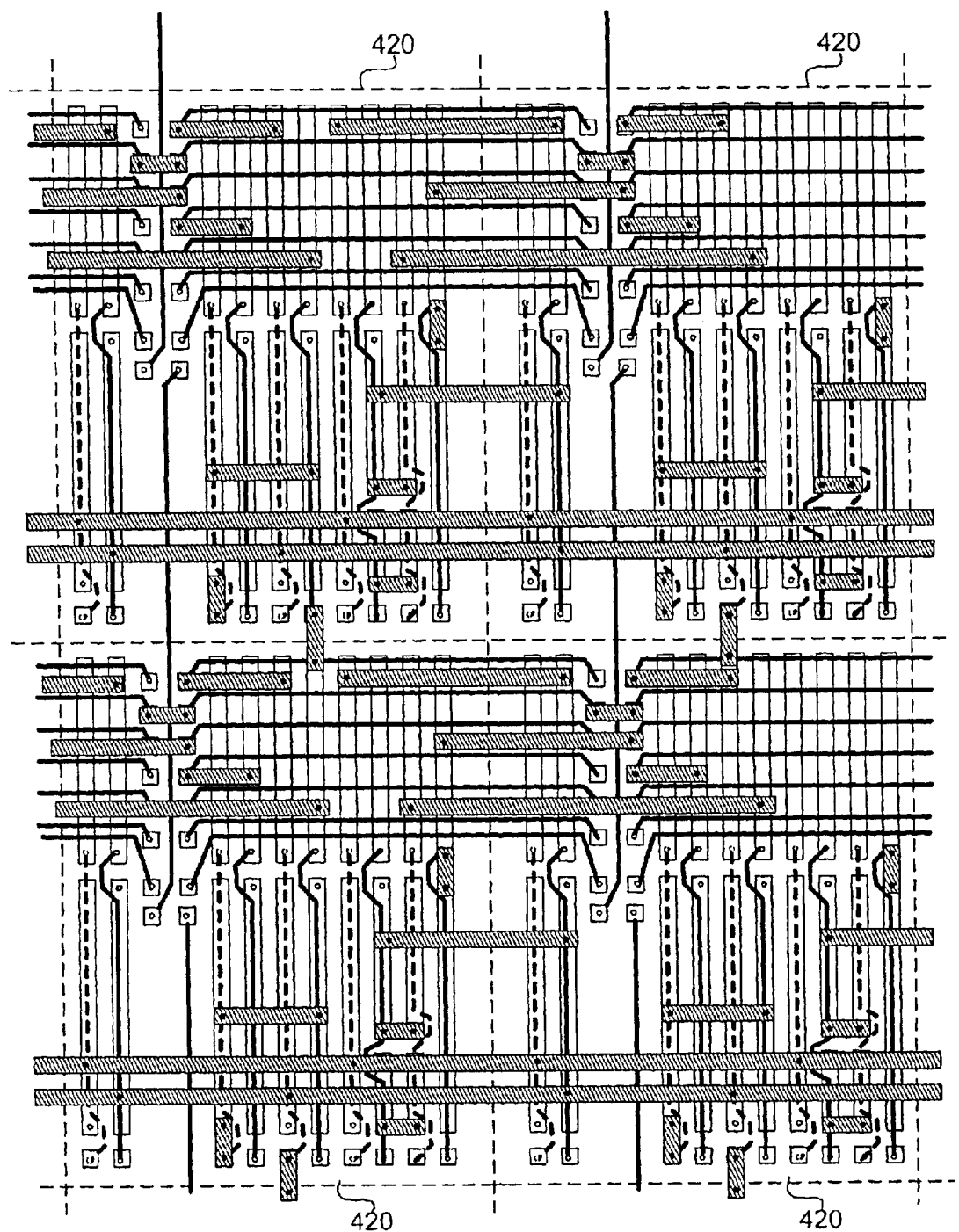
FIG. 10 is similar to FIG. 9, but illustrates the routing structure for four adjacent function blocks.

The entire resulting routing structure is shown in FIG. 9, which illustrates all four layers M5–M8 formed over a single function block 420. FIG. 10 is an expanded view of a routing structure shown in FIG. 9, illustrating several adjacent function blocks with the routing structure as interconnected. As should be understood, conductors are shown in M8 for illustration, but because they are customizable, they will be distinctly located with each use of an embodiment of the invention.

As a result of the routing structure described with respect to FIGS. 6 through 10, pins to the function blocks are included within the routing fabric, unlike conventional routing structures where routing is typically done over pins. In addition, freeways are formed independent of the pins, and routing, therefore, can actually be performed under the pins. In fact every vertical pin track includes a pin as well as a freeway. As well, there is free global routing while providing distinct local routing. But, although there is both local and global routing within the structure, the entire routing fabric is formed over the function blocks and does not require channel regions in between function blocks nor does it render any function blocks unusable. Finally, the routing structure allows for long conductors both horizontally and vertically that can be formed both under and over portions of the routing fabric. As a result, a structure in accordance with an embodiment of the invention provides a routing structure that is not only extremely flexible, but extremely compact. The structure further allows for rapid turn around time of customized ASICs in that only one metal layer requires customization.

Figure 11:
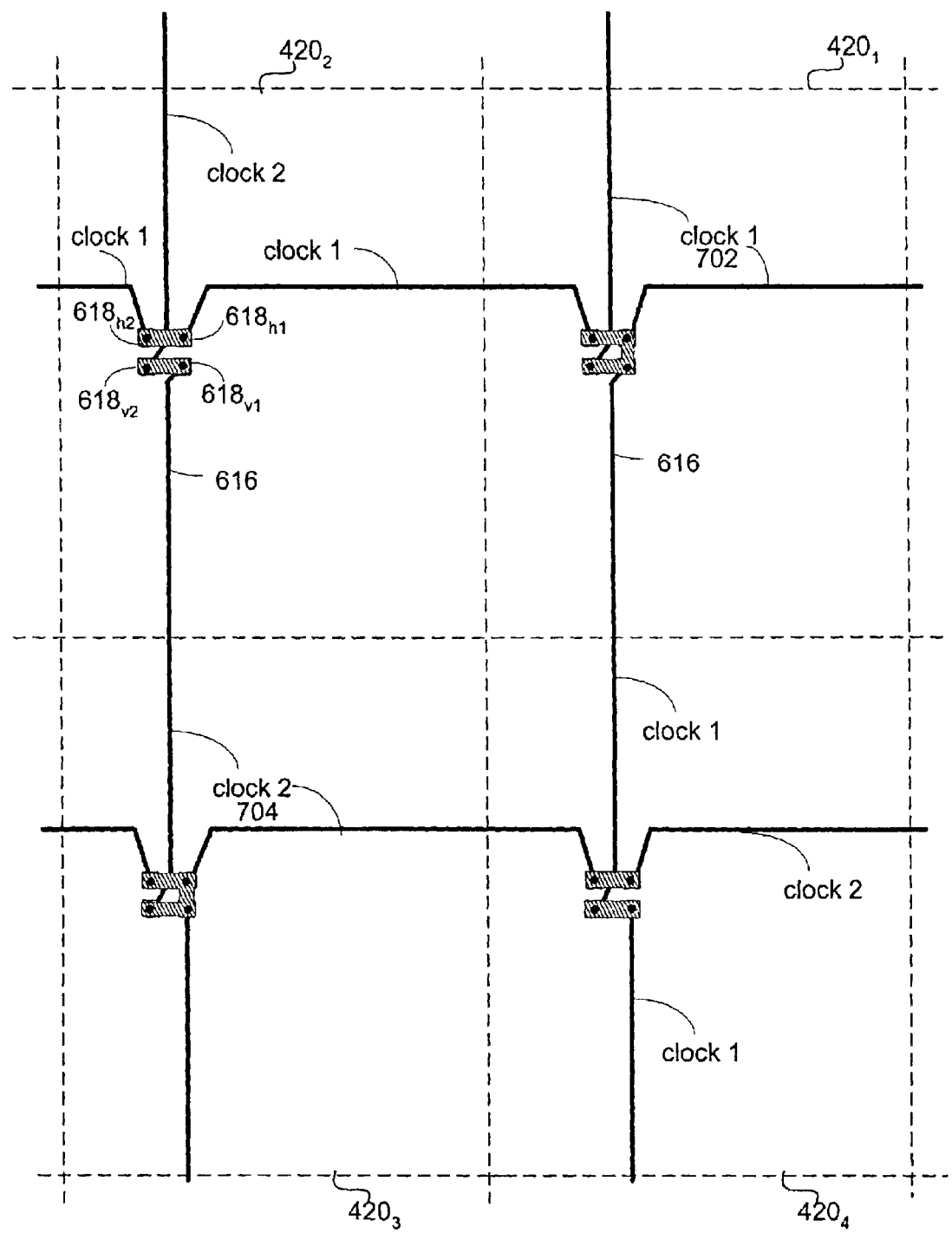
FIG. 11 illustrates multiple clock trees in accordance with an embodiment of the invention.

In addition, as previously described, having conductors 616 is useful for building clock trees, which can be used for forming a consistent clocking network over a large area and can aid in minimizing clock skew. Further, conductors 616 can be used for forming multiple clock domains. For instance, referring to FIG. 11, four function blocks are shown $420_1$, $420_2$, $420_3$, and $420_4$. In $420_1$, all four of the conductors 618 are connected with customized layer M8 to form a clock tree 702 for clock 1 (note that conductors 618 are not visible in FIG. 11 as they are covered with conductors from M8). As the clock tree 702 passes to other function blocks, selected conductors 618 can be coupled to it. For instance in $420_2$ those conductors $618_{H1}$ and $618_{H2}$ that continue the clock in the horizontal direction are coupled to it. But in function block $420_3$ a new clock tree 704 (clock 2) is formed that is distinct from tree 702. When tree 704 passes into block $420_2$, only those conductors $618_{V1}$ and $618_{V2}$ that move the clock in the vertical direction are coupled to it. In this manner, many clock domains throughout the array can be easily defined.

Finally, in some embodiments local routing can be done using macros and such routing does not interfere with global custom routing. For instance, a user can select macros from a library, where the selected library function can then be implemented with local routing.

Although embodiments of the invention have been described that use the top four conducting layers of an ASIC, e.g., M5–M8, other embodiments may place additional custom or fixed layers over an embodiment of a routing structure in accordance with the invention. Still other embodiments could rearrange the layers so that the custom layer is below, above, or between, any of the layers that form the fixed routing structure. Accordingly, while the top four layers are used in various embodiments, these layers are exemplary only and the invention is not so limited.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. An integrated circuit, comprising:

an array of function blocks, wherein each function block has an input and an output;

a predesigned routing structure formed over the array, wherein the predesigned routing structure includes a plurality of conducting layers that include a plurality of conductive pin segments and a plurality of electrically unbroken conductive paths, wherein each conductive pin segment carries a respective input or output, wherein the structure includes a plurality of tracks, and wherein in each track is located at least a portion of at least one respective electrically unbroken conductive path and at least one respective conductive pin segment in one of the plurality of conducting layers, and wherein the electrically unbroken conductive path is within the predesigned routing structure, ohmically uncoupled to the respective conductive pin segment.

2. The integrated circuit of claim 1, wherein each electrically unbroken conductive includes portions formed on two conducting layers.

3. The integrated circuit of claim 1, wherein each electrically unbroken conductive includes portions formed on two conducting layers and wherein a portion of each electrically unbroken conductive path is formed substantially under the conductive pin segment located in the same track as the electrically unbroken conductive path.

4. The integrated circuit of claim 1, further including a customized conducting layer, wherein the customized conducting layer electrically connects first selected conductive pin segments to selected electrically unbroken conductive paths, second selected conductive pin segments to other selected conductive pin segments, third selected conductive pin segments to a power line, and fourth selected conductive pin segments to a ground line.

5. The integrated circuit of claim 1, further including:

a customized conducting layer formed over the predesigned routing structure and including a power line and a ground line, wherein the power line and the ground line are placed so as not to prevent the electrical connection of an electrically unbroken conductive path to a conductive pin segment by the customized conducting layer.

6. The integrated circuit of claim 1, further including:

a customized conducting layer formed over the predesigned routing structure, wherein a first portion of the customized conducting layer formed over the conductive pin segments is for local routing and a second portion of the customized conducting layer is for global routing.

7. The integrated circuit of claim 1, further including:

a plurality of conductors for carrying at least one clock signal, wherein the plurality of conductors are within the predesigned routing structure, ohmically unconnected to the conductive pin segments or electrically unbroken conductive paths, and wherein the plurality of conductors can be electrically interconnected in a custom conducting layer to form multiple clock domains.

8. An integrated circuit, comprising:
an array of function blocks, wherein each function block has an input and an output;
a predesigned routing structure formed over the array, including:
a first conducting layer having a plurality of parallel vertical tracks, wherein included in each track is a conductive pin segment carrying a respective input or output and in each track is a first portion of an electrically unbroken conductive path, wherein the conductive pin segment and the first portion are within the predesigned routing structure, ohmically unconnected to one another;
for each track, a second portion of the electrically unbroken conductive path, wherein the second portion is formed in at least one other conducting layer.

9. The integrated circuit of claim 8, wherein the second portion is formed substantially under the conductive pin segment for the respective track.

10. The integrated circuit of claim 8, wherein the electrically unbroken conductive path runs the vertical height of a function block.

11. The integrated circuit of claim 8, wherein the electrically unbroken conductive path is longer than the conductive pin segment.

12. The integrated circuit of claim 8, wherein for every other track in the first conducting layer, the second portion of the electrically unbroken conductive path is formed in a second conducting layer under the first conducting layer, for the remaining tracks, the second portion of the electrically unbroken conductive path is formed in a third conducting layer under the second conducting layer.

13. The integrated circuit of claim 8, wherein:
the predesigned routing structure further includes horizontal conductors formed under the first portion of the electrically unbroken conductive paths and connected through at least one via to the first conducting layer.

14. The integrated circuit of claim 8, further including a customized conducting layer wherein the customized conducting layer includes conductors that are connected through at least one via to the first conducting layer and wherein the customized conducting layer is used to form a user-defined circuit on the integrated circuit.

15. The integrated circuit of claim 8, further including a customized conducting layer formed over the predesigned routing structure, wherein a first portion of the customized conducting layer formed over the conductive pin segments is for local routing and a second portion of the customized conducting layer is for global routing.

16. The integrated circuit of claim 8, further including:
a customized conducting layer formed over the predesigned routing structure and including a power line and a ground line, wherein the power line and the ground line are placed so as not to prevent any desired electrical connection of an electrically unbroken conductive path to a conductive pin segment by the customized conducting layer.

17. The integrated circuit of claim 8, including:
a plurality of conductors for carrying at least one clock signal, wherein the plurality of conductors are within the predesigned routing structure, ohmically unconnected to the conductive pin segments or vertical conductors, and wherein the plurality of conductors can be electrically interconnected in a custom conducting layer to form multiple clock domains.

18. An integrated circuit, comprising:
an array of function blocks, to be used in the formation of a user-defined circuit, wherein each function block includes a device layer and at least one device interconnect layer, and wherein each function block has an input and an output;
a routing structure formed over the array including four conducting layers, the routing structure including:
a first predesigned conducting layer including a plurality of parallel vertical tracks, wherein each track includes a conductive pin segment carrying a respective input or output, and wherein each track includes a first portion of an electrically unbroken conductive path, wherein the conductive pin segment and the first portion of the electrically unbroken conductive path are ohmically unconnected to one another; in the first predesigned conducting layer,
a second predesigned conducting layer formed under the first conducting layer, wherein for a first group of alternate vertical tracks in the first conducting layer, the second conducting layer includes a second portion of each electrically unbroken conductive path, wherein the second portion is formed substantially under the respective conductive pin segment,
a third predesigned conducting layer formed under the second conducting layer, wherein for a second group of alternate vertical tracks in the first conducting layer, the third conducting layer includes a second portion of each electrically unbroken conductive path, wherein the second portion is formed substantially under the respective conductive pin segment, and
a customized conducting layer formed over the first predesigned conducting layer and connected through at least one via to the first conducting layer, wherein the customized conducting layer has been formed in accordance with a user-defined circuit.

19. The integrated circuit of claim 18, wherein:
the second predesigned conducting layer includes horizontal conductors connected through at least one via to the first conducting layer.

20. The integrated circuit of claim 18, wherein the customized conducting layer includes a power line and a ground line, wherein the power line and the ground line are placed so as not to prevent any desired electrical connection of an electrically unbroken conductive path to a conductive pin segment by the customized conducting layer.

21. The integrated circuit of claim 18, wherein:
the customized conducting layer has been formed into a local routing portion and a global routing portion.

22. The integrated circuit of claim 21, wherein:
the local routing portion is formed over the area occupied by the conductive pin segments of the first conducting layer.

23. The integrated circuit of claim 18, wherein:
the second predesigned conducting layer includes conductors for use in clock distribution.

24. The integrated circuit of claim 18, wherein:
the second predesigned conducting layer includes conductors for use in clock distribution wherein the conductors for use in clock distribution can be electrically interconnected by a customized conducting layer to form multiple clock domains.

25. An integrated circuit, comprising:

an array of function blocks, wherein each function block has an input and an output;

a predesigned routing structure formed over the array, wherein the routing structure includes four clock conductors, which can be electrically interconnected in a custom layer to form multiple clock domains, wherein a first one of the clock conductor extends vertically upwards, a second one of the clock conductor extends vertically downwards, a third one of the clock conductor extends horizontally to the right, and a fourth one of the clock conductor extends horizontally to the left.

26. The integrated circuit of claim 25, further including the custom layer, wherein the four clock conductors in a first function block are electrically interconnected to form a first clock tree, and wherein the four clock conductors in a second function clock are electrically interconnected to form a second clock tree.

27. An integrated circuit, comprising:

an array of function blocks, wherein each function block has an input and an output;

a predesigned routing structure formed over the array, including:

a first conducting layer having a plurality of parallel vertical tracks, wherein included in each track is a conductive pin segment carrying a respective input or output and in each track is a first portion of an electrically unbroken conductive path, wherein the conductive pin segment and the first portion are within the first conducting layer, ohmically unconnected to one another;

for each track, a second portion of the electrically unbroken conductive path, wherein the second portion is formed in at least one other conducting layer;

a plurality of clock conductors, wherein selected ones of the clock conductors can be electrically interconnected with a customized conducting layer to form multiple clock domains.

28. The integrated circuit of claim 27, wherein the second portion is formed substantially under the conductive pin segment for the respective track.

29. The integrated circuit of claim 27, wherein the electrically unbroken conductive path runs the vertical height of a function block.

30. The integrated circuit of claim 27, wherein the electrically unbroken conductive path is longer than the conductive pin segment.

31. The integrated circuit of claim 27, wherein for every other track in the first conducting layer, the second portion of the electrically unbroken conductive path is formed in a second conducting layer under the first conducting layer, and wherein for the remaining tracks, the second portion of the electrically unbroken conductive path is formed in a third conducting layer under the second conducting layer; and wherein the plurality of clock conductors are formed in the second conducting layer.

32. The integrated circuit of claim 27, further including the customized conducting layer, wherein the customized conducting layer includes conductors that are connected through at least one via to the first conducting layer and wherein the customized conducting layer is used to form a user-defined circuit on the integrated circuit.

33. The integrated circuit of claim 27, wherein the plurality of clock conductors includes four clock conductors in a second conducting layer formed under the first conducting layer, wherein the four conductors are ohmically unconnected to one another in the second conducting layer.

* * * * *